United States Patent [19]

Hartman et al.

[11] 4,222,165
[45] Sep. 16, 1980

[54] TWO-PHASE CONTINUOUS POLY SILICON GATE CCD

[75] Inventors: John M. Hartman, Glendale; George S. Leach, Phoenix, both of Ariz.

[73] Assignee: EMM Semi, Inc., Phoenix, Ariz.

[21] Appl. No.: 945,453

[22] Filed: Sep. 25, 1978

Related U.S. Application Data

[62] Division of Ser. No. 750,774, Dec. 15, 1976, Pat. No. 4,156,247.

[51] Int. Cl.$^3$ .............................................. B01J 17/00
[52] U.S. Cl. ....................................... 29/579; 29/578; 29/589
[58] Field of Search ............. 29/571, 578, 579, 576 B, 29/589; 357/59, 91

[56] References Cited

U.S. PATENT DOCUMENTS 4,167,017  9/1979  Tasch ...................................... 357/91

Primary Examiner—W. C. Tupman

[57] ABSTRACT

This invention provides the structure for a two-phase charge coupled storage device. Alternate regions of thicker and thinner silicon dioxide are grown upon a silicon substrate. These silicon dioxide regions are covered with a layer of deposited, undoped polysilicon. A layer of silicon dioxide is grown over the polysilicon. Ion implantation is applied to cause isolated regions of conductivity in the polysilicon. Then contact windows are cut in the upper most layer of silicon dioxide exposing the polysilicon therethrough and a metal coating is deposited in the contact windows. Two-phase signals are applied to the resulting electrodes to advance charges at the surface of the silicon substrate.

4 Claims, 5 Drawing Figures

TWO-PHASE CONTINUOUS POLY SILICON GATE CCD

This is a division of application Ser. No. 750,774, filed Dec. 15, 1976, now U.S. Pat. No. 4,156,247.

BACKGROUND OF THE INVENTION

This invention relates to charge coupled storage devices and more particularly to improvements therein.

The present preferred construction for a charged coupled storage device is one which has three or more clock phases for operating the device. The electrode structure of the three phase charge coupled device, or CCD, as it is more popularly known, has problems in that a gap is present between the metal electrode used for advancing charges down the CCD. The gap cannot be too wide, since if it is, one no longer has a homogenous flat surface potential underneath the CCD gates, which is necessary in order to enable the transfer of charge between the regions underneath the gates. The gap preferably should be on the order of one to two microns maximum. Thus far, the ability to etch geometrys that fine in production does not exist. In an attempt to overcome this, the industry uses overlapping gates in which the first and third gates are metal gates and the second gate is a poly silicon gate photolithic structure. This is a very complex structure. The overlapping gates, further more, give rise to objectionable interelectrode capacitance.

OBJECTS AND SUMMARY OF THE INVENTION

An object of this invention is the provision of a novel high density two-phase CCD.

Another object of this invention is the provision of a two-phase CCD that is simple to construct.

The foregoing and other objects of this invention may be achieved in an arrangement wherein on a silicon substrate, there is grown a layer of silicon dioxide ($SiO_2$) which has alternate thick and thin regions. A thin, high resistivity layer of undoped poly silicon is deposited over the entire silicon dioxide layer. A thin, uniform coating of silicon dioxide is then grown over the poly silicon layer.

The device is then subjected to ion-implantation in a manner so that ion-implantation exists substantially only at the peaks and in the troughs of the polysilicon which are formed on the surface as a result of the alternate thick and thin silicon dioxide lying underneath. The sloping sides joining the peaks and troughs are substantially not affected by the ion implantation.

So much of the top $SiO_2$ layer, as extends partially over each peak, then down to a trough and partially along the trough, is next removed to form a window for contacting the polysilicon layer and in its place a conductive metal is deposited to form electrodes. The conductive metal is deposited over the windows exposing the polysilicon layer. Each CCD electrode consists of the conductive polysilicon on the peak which becomes the transfer electrode, and the conductive poly silicon in the trough which becomes the storage electrode. The metal interconnects the two electrodes for each phase. Note that between phases the metal does not interconnect resulting in isolated electrodes.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
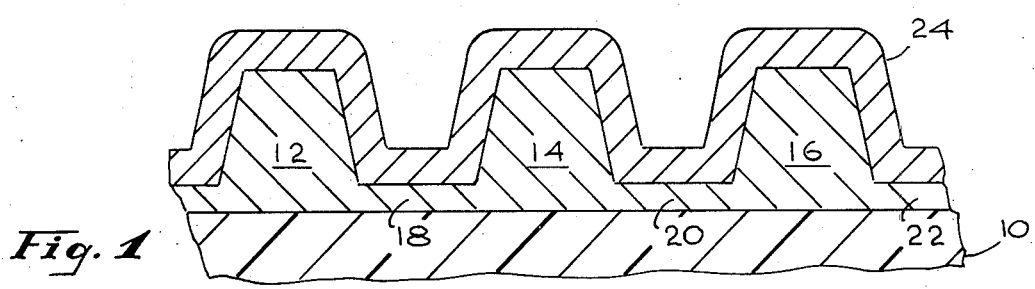
FIG. 1 is a view in section of a first step in the construction of an embodiment of this invention.

Referring now to FIG. 1, there is illustrated in cross section a first step in constructing an embodiment of this invention. On a silicon substrate 10, which may be on the order of 10 mils thick, there is grown silicon dioxide, which has alternate thick regions 12, 14, 16, and alternate thin regions 18, 20, 22. The thick regions 12, 14, 16, may be on the order of 6000 angstroms thick, and the thin regions may be on the order of 660 angstroms thick.

There is deposited over both thick and thin regions, a polysilicon layer 24, which has a very high resistivity, and is undoped, and may be on the order of 1500 angstroms thick. It will be noted, that the thick regions of the silicon dioxide form peaks and the thin regions form troughs. The troughs are on the order of 0.2 mils wide and the peaks are on the order of 0.3 mils wide.

It should be appreciated that the foregoing dimensions are illustrative and should not be considered as restrictive or as limitations upon this invention.

Figure 2:
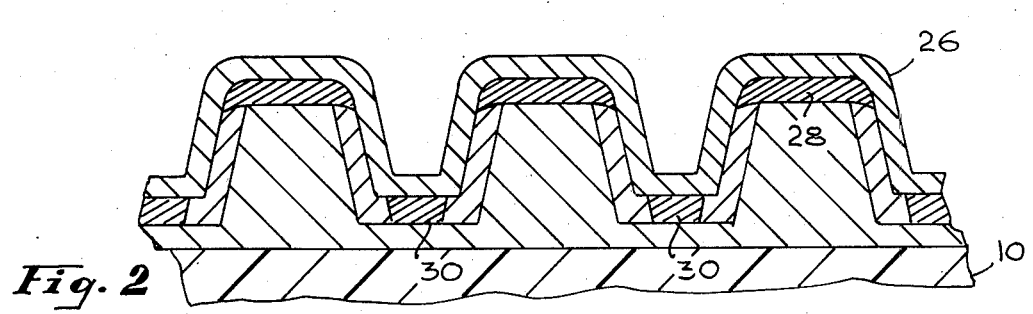
FIG. 2 is a view in section of the next step in the construction of the embodiment of the invention.

FIG. 2 illustrates in cross section, the next step in the construction of a two-phase CCD, in accordance with this invention. There is grown over the polysilicon layer, another silicon dioxide layer 26, which may be on the order of 1000 angstroms thick. Thereafter, the silicon dioxide surface is subjected to ion-implantation in order to obtain conductive regions. The implantation is perpendicular to the surface so that the ion-implantation substantially occurs in polysilicon regions at the peak and troughs respectively 28, 30, of the device, as represented by the shaded areas. In short, in view of the steep side slopes, between peaks and troughs, the ion-implantation regions are not continuous.

Figure 3:
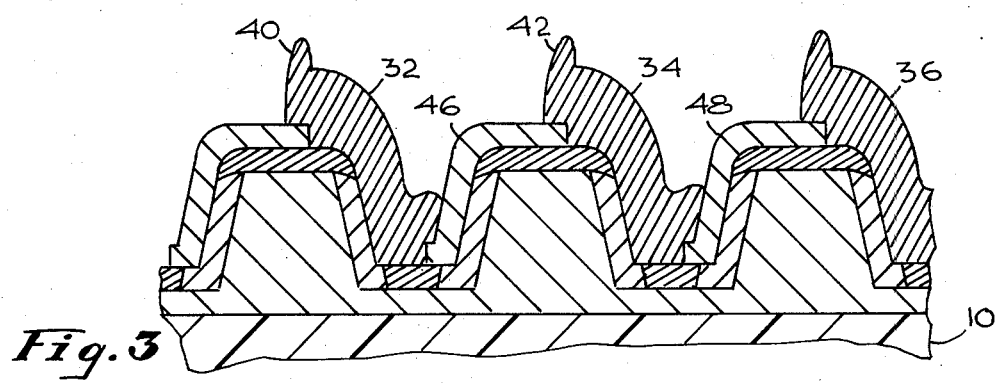
FIG. 3 is a view in section showing the finished appearance of the embodiment of the invention.
Figure 4:
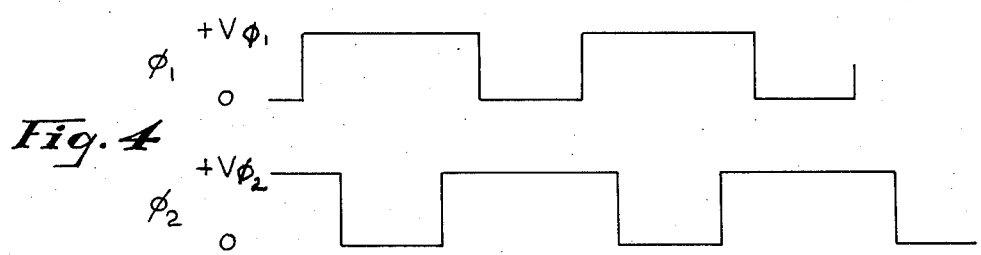
FIG. 4 illustrates waveforms used to drive the two-phase CCD of this invention.

Referring now to FIG. 3, the final step in the construction of the embodiment of the invention is shown in cross section. Contact windows are cut in the silicon dioxide over the polysilicon, as by chemical etching, so that effectively the underlying polysilicon surface extending from a peak down to a trough is exposed. The exposed polysilicon as well as a portion of the silicon dioxide adjacent thereto then has a conductive metal coating, respectively 32, 34, 36 and is applied thereto to form the electrodes. This metal may be aluminum. For the purposes of applying operating signals interconnecting conductors not shown connect the electrodes respectively 32, 34, 36 to the peripheral driving circuitry from which the waveforms shown in FIG. 4 are developed. Each metal electrode connects the ion implant region at a peak with the ion implant region in a succeeding trough whereby the transfer and storage regions of a two-phase CCD structure is made possible.

FIG. 4 shows waveforms illustrating the two-phase driving waveforms used for advancing charge patterns along the CCD. The $\theta 1$ and $\theta 2$ waveforms illustrate pulse trains in which a $\theta 2$ pulse rises to its maximum before a $\theta 1$ pulse falls to its minimum and a $\theta 2$ pulse terminates just after a $\theta 2$ pulse starts to rise.

Figure 5:
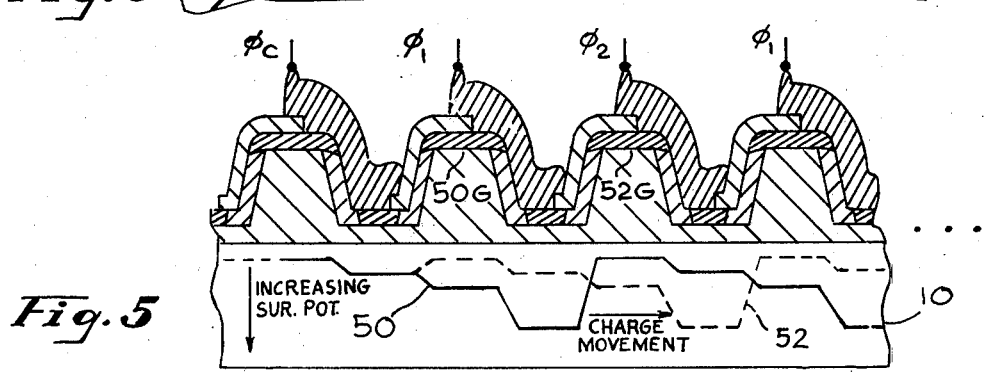
FIG. 5 is a cross sectional view of an embodiment of this invention together with a surface potential waveform, shown to provide a better understanding of the operation of this invention.

FIG. 5 is a cross sectional view of an embodiment of the invention and adjacent thereto waveforms illustrating movement of a charge pattern and surface potential waveform during a typical cycle.

Charges are clocked into the two-phase CCD device at the input terminal $\theta C$ by applying a potential thereto. Thereafter by applying a $\theta 1$ pulse to the first terminal marked $\theta 1$, a surface potential 50 is established under the polysilicon gate 50G. The movement of the charges is determined by the surface potential; the charges seek highest surface potential which represents the lowest energy state and so they migrate under the thinner silicon dioxide region.

The $\theta 2$ waveform turns on before the $\theta 1$ waveform collapses. As $\theta 1$ collapses the surface potential underneath the $\theta 1$ polysilicon gate 50G collapses. There is nowhere for the charges to go but to the right under the $\theta 2$ electrode 52G which is high, with the resulting surface potential represented by the dotted line 52. Thus, a charge pattern can be transferred down the CCD device. Charge input and charge readout from the device is done in a manner well known to those skilled in the CCD art.

There has accordingly been described and shown a novel and useful construction for a two-phase charge coupled storage device.

We claim:

1. The method of fabricating a two-phase charge coupled storage device comprising:
    growing a first layer of silicon dioxide on a substrate of silicon, said first layer having alternate thicker and thinner regions,
    depositing a substantially uniform layer of polysilicon over the surface of said first layer of silicon dioxide to define a peak over each said thicker region and a trough over each said thinner region,
    growing a substantially uniform second layer of silicon dioxide over said polysilicon layer,
    implanting ions substantially solely in the portions of said polysilicon layer which are at the peaks and troughs regions to render said portions of said polysilicon layer conductive relative to the regions therebetween.
    removing those portions of said second silicon dioxide layer which extend from an end portion of each peak down to and almost through the adjacent trough to present a plurality of windows to the polysilicon layer,
    depositing a conductive metal layer in each of said windows in contact with the polysilicon layer and extending over a portion of the second silicon dioxide layer adjacent each of said windows.

2. The method of fabricating a two-phase charge coupled storage device comprising:
    forming a first layer of silicon dioxide on a substrate of silicon, said first layer having alternate thicker and thinner regions and steeply inclined regions joining the thicker and thinner regions,
    depositing a substantially uniform layer of polysilicon over the surface of said first layer of silicon dioxide to define a peak layer over each said thicker region and a trough layer over each said thinner region and a steeply inclined layer overlying each steeply inclined region and joining the peak and trough layers,
    forming a substantially uniform second layer of silicon dioxide over said polysilicon layer conforming to the peak, trough and steeply inclined areas,
    directing a stream of ions at the second silicon dioxide layer substantially perpendicular to the peaks and troughs to substantially penetrate only the portions of the second silicon dioxide layer overlying the peak and trough polysilicon layers to substantially ion implant only the peak and trough polysilicon layers with the steeply inclined polysilicon layers remaining relatively non-conductive relative to the ion implanted peak and trough layers,
    removing those portions of said second silicon dioxide layer which extend continuously over an end portion of each peak polysilicon layer down the adjacent steeply inclined polysilicon layer and to and partly through the adjacent trough polysilicon layer to present a plurality of windows through the second silicon dioxide layer to the polysilicon layer to expose the corresponding portions thereof,
    depositing a conductive metal layer in each of said windows in contact with and overlying the corresponding exposed portions of said polysilicon layer and extending over a portion of the second silicon dioxide layer adjacent each of said windows.

3. The method comprising the steps of:
    forming a unitary body of a single semiconductor material, said body having a plurality of low conductivity elevated surface regions each joined by a low conductivity steeply inclined intermediate surface region to a successive low conductivity depressed surface region, all of the elevated and depressed surface regions being substantially aligned with each other,
    forming a substantially uniform thickness layer of a second material over the body of semiconductor material conforming to the elevated and depressed and intermediate surface regions,
    directing a stream of ions at the layer of second material substantially perpendicular to the alignment of the low conductivity elevated and depressed regions to substantially penetrate through only the portions of the layer of second material overlying the elevated and depressed regions of the semiconductor body to simultaneously substantially ion implant and render relatively conductive only said elevated and depressed regions of the semiconductor body, the stream of ions being substantially absorbed in the portions of the layer of second material overlying the low conductivity steeply inclined intermediate regions so as to substantially fail to penetrate therethrough to the steeply inclined low conductivity intermediate regions of the semiconductory body,
    whereby the successive elevated and depressed regions of the semiconductor body are simultaneously rendered relatively conductive with respect to the low conductivity steeply inclined intermediate regions.

4. The method of claim 3 wherein in said forming step, the second material is silicon dioxide.

* * * * *